(12) United States Patent
Seiler et al.

(10) Patent No.: US 9,338,914 B2
(45) Date of Patent: May 10, 2016

(54) TRANSPORT SECURING DEVICE FOR A BATTERY UNIT

(75) Inventors: Christian Seiler, Auggen (DE); Marc Fiedler, Reinach (CH); Stefan Probst, Weil am Rhein (DE); Uwe Mannbar, Village Neuf (FR); Werner Thoren, Steinen (DE)

(73) Assignee: ENDRESS + HAUSER PROCESS SOLUTIONS AG, Reinach (CH)

( * ) Notice: Subject to any disclaimer, the term of this patent is extended or adjusted under 35 U.S.C. 154(b) by 414 days.

(21) Appl. No.: 13/995,788

(22) PCT Filed: Nov. 23, 2011

(86) PCT No.: PCT/EP2011/070847
§ 371 (c)(1),
(2), (4) Date: Jun. 19, 2013

(87) PCT Pub. No.: WO2012/084393
PCT Pub. Date: Jun. 28, 2012

(65) Prior Publication Data
US 2013/0279099 A1   Oct. 24, 2013

(30) Foreign Application Priority Data
Dec. 21, 2010  (DE) .......................... 10 2010 063 777

(51) Int. Cl.
*H05K 7/02* (2006.01)
*G01D 11/24* (2006.01)
*H01M 2/10* (2006.01)
(Continued)

(52) U.S. Cl.
CPC .................. *H05K 7/02* (2013.01); *G01D 11/24* (2013.01); *H01M 2/1022* (2013.01); *H01M 2/30* (2013.01); *H01M 10/42* (2013.01); *H01M 2200/00* (2013.01)

(58) Field of Classification Search
None
See application file for complete search history.

(56) References Cited

U.S. PATENT DOCUMENTS

| 4,751,452 A | 6/1988 | Kilmer et al. |
| 5,739,666 A * | 4/1998 | Nierescher ............ H01M 2/105 320/111 |
| 5,903,132 A | 5/1999 | Ohira et al. |

(Continued)

FOREIGN PATENT DOCUMENTS

| DE | 697 33 052 T2 | 1/2006 |
| WO | 2006/027284 A1 | 3/2006 |
| WO | 2011139653 A2 | 11/2011 |

OTHER PUBLICATIONS

German Search Report dated Mar. 31, 2011, issued in Application No. 10 2010 063 777.7, in Munich, Germany.

(Continued)

*Primary Examiner* — Alix Eggerding
(74) *Attorney, Agent, or Firm* — Bacon & Thomas, PLLC

(57) ABSTRACT

An apparatus having an electronics unit and a battery unit for energy supply of the electronics unit, wherein the battery unit has a first formed part, and wherein the electronics unit has a second formed part. The first and second formed parts are connectable with one another, wherein, by orienting, especially by rotating, the first formed part, respectively the second formed part, the first formed part and the second formed part are connectable with one another in different installed positions, and wherein the energy supply of the electronics unit occurs from the battery unit as a function of the installed position, in which the first formed part is connected with the second formed part.

16 Claims, 1 Drawing Sheet

(51) Int. Cl.
*H01M 2/30* (2006.01)
*H01M 10/42* (2006.01)

(56) References Cited

U.S. PATENT DOCUMENTS

| | | | |
|---|---|---|---|
| 6,139,359 A * | 10/2000 | Fuhreck | H01R 13/6277 439/349 |
| 6,357,534 B1 | 3/2002 | Buetow et al. | |
| 6,459,176 B1 * | 10/2002 | Brockel | H01M 2/105 307/150 |
| 7,682,726 B2 | 3/2010 | Rejman et al. | |
| 7,887,942 B2 | 2/2011 | Rejman et al. | |
| 2009/0111008 A1 | 4/2009 | Wen | |
| 2011/0068742 A1 | 3/2011 | McCurry et al. | |

OTHER PUBLICATIONS

International Preliminary Report on Patentability dated May 3, 2012, issued in Application No. PCT/EP2011/070847, in Rijswijk, the Netherlands.

International Preliminary Report on Patentability dated Jul. 4, 2013, issued in Application No. PCT/EP2011/070847, in Geneva, Switzerland.

* cited by examiner

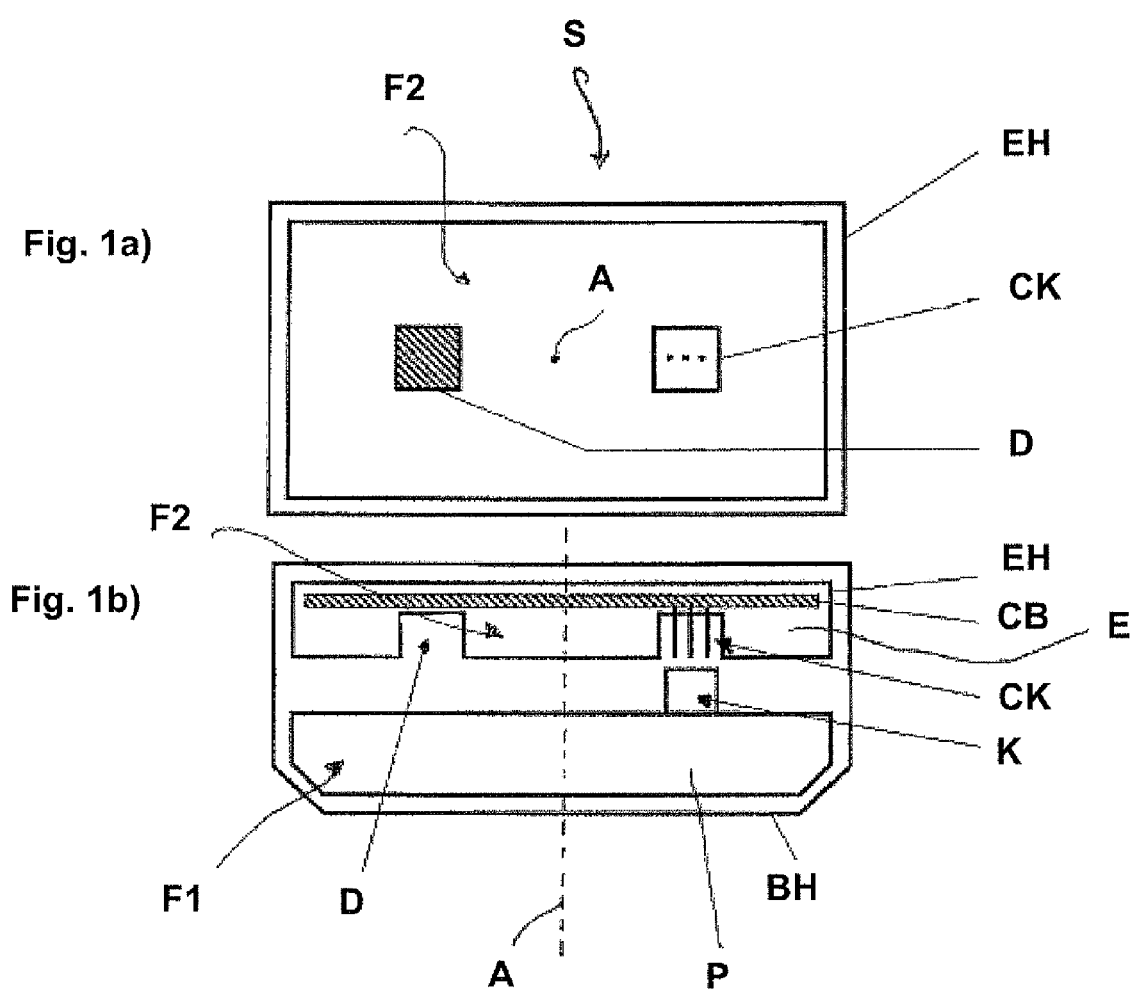

TRANSPORT SECURING DEVICE FOR A BATTERY UNIT

TECHNICAL FIELD

The invention relates to an apparatus having an electronics unit and a battery unit for energy supply of the electronics unit, wherein the battery unit has a first formed part, and wherein the electronics unit has a second formed part, wherein the first and second formed parts are connectable with one another.

BACKGROUND DISCUSSION

The invention relates, furthermore, to a battery unit for application in such an apparatus. The invention relates additionally to an operating electronics for application in such an apparatus. The invention relates, moreover, to a field device of process automation technology, especially a radio unit, having such an apparatus.

In process automation technology as well as in manufacturing automation technology, field devices are often applied, which serve for registering and/or influencing process variables. Serving for registering process variables are measuring devices, respectively sensors, such as, for example, fill level measuring devices, flow measuring devices, pressure- and temperature measuring devices, pH, redox potential measuring devices, conductivity measuring devices, etc., which register the corresponding process variables, fill level, flow, pressure, temperature, pH-value, and conductivity. Serving for influencing process variables are actuators, such as, for example, valves or pumps, via which the flow of a liquid in a section of pipeline, or the fill level in a container, can be changed.

Referred to as field devices are, in principle, all devices, which are applied near to the process and which deliver, or process, information relevant to the process. Besides the above mentioned measuring devices/sensors and actuators, also referred to as field devices are generally units, which are connected directly to a fieldbus and serve for communication with superordinated units, such as e.g. remote I/Os, gateways, linking devices and radio units. A large number of such field devices are produced and sold by the firm, Endress+Hauser.

In modern industrial plants, field devices are, as a rule, connected via bus systems (Profibus®, Foundation Fieldbus®, HART®, etc.) with superordinated units. Normally, the superordinated units involve control systems, or control units, such as, for example, a PLC (programmable logic controller). Superordinated units serve, among others things, for process control, process visualizing, process monitoring as well as for start-up of the field devices. The measured values registered by the field devices, especially by sensors, are transmitted via the connected bus system to one, or, in given cases, also a number of, superordinated unit(s). Along with that, also data transmission from the superordinated unit via the bus system to the field devices is required; this serves especially for configuring and parametering field devices or for diagnostic purposes. In general, the field device is serviced via the bus system from the superordinated unit.

Besides a wired data transmission between the field devices and the superordinated unit, there is also the opportunity for wireless (wireless) data transmission. Especially, in the bus systems Profibus®, Foundation Fieldbus® and HART®, a wireless data transmission via radio is specified. Furthermore, radio, or wireless, networks for sensors are specified in greater detail in the standard IEEE 802.15.4.

For implementing wireless data transmission, newer field devices, especially sensors and actuators, can be embodied as radio field devices. These have, as a rule, a radio unit and an electrical current source as integral components. In such case, the radio unit and the electrical current source can be provided in the field device or in a radio unit connected durably to the field device. The electrical current source enables an autarkic energy supply of the field device.

Along with that, there is the opportunity for retrofitting field devices that do not have internal radio units—thus the installed base—to become radio field devices by externally providing them with at least one radio unit. A corresponding radio unit is described, for example, in the publication WO 2005/103851 A1. The radio unit is, as a rule, connected releasably to a fieldbus communication interface of the field device. Via the fieldbus communication interface, the field device can transmit to the radio unit the data to be transferred via the bus system. The radio unit then transmits the data via radio to the target location. Conversely, the radio unit can receive data via radio and forward such via the fieldbus communication interface to the field device. The supplying of the field device with electrical power occurs then, as a rule, via an energy supply unit of the radio unit.

In the case of autarkic radio field devices with or without external radio unit, communication, for example, with a superordinated unit, is conducted, as a rule, via the wireless interface of the radio field device, or the external radio unit, as the case may be. Additionally, such radio field devices, respectively radio units, have, as a rule, a wired communication interface. For example, it is provided in the HART® standard that radio field devices must have, besides a wireless interface, also a wired communication interface. Via such a wired communication interface, for example, on-site, a configuration of the radio field device, respectively the radio unit, is possible via a service unit, such as, for example, a handheld communicator, which is connected to the wired communication interface. Furthermore, the wired communication interface can be embodied as a fieldbus communication interface, so that the communication is conducted thereby in accordance with a bus system, such as, for example, one of the standardized bus systems, Profibus®, Foundation Fieldbus® or HART®. Via such a fieldbus communication interface, the radio field device, or the radio unit, can also be connected to a corresponding wired fieldbus.

These field devices, respectively radio units, have electronics, i.e. electronic units, for performing their functions and functionalities. These electronic units have, for example, programs or algorithms, by which the corresponding functions are executed. To this end, the electronics unit requires a certain amount of electrical energy. The energy supply unit, respectively the electrical current source, of a radio unit, a field device or a radio field device is usually a battery. Known from Offenlegungsschrifts (laid-open German applications), DE 102008036554 A1, DE 102008037193 A1, DE 200810038415 A1 are such battery units, which are applied preferably in process automation. The term, battery, means, in such case, generally, besides a galvanic cell, also other energy storage units, such as, for example, a rechargeable battery.

Furthermore, it is also usual to connect the battery via cable with the corresponding electronics unit, which in the case of a field device, is also referred to as the operating electronics. A contacting of the battery occurs then preferably first in the case of start-up of a corresponding field device, i.e. the cable is, during storage and transport, not connected with the electronics unit, respectively the battery. Cables with a coupling and/or corresponding plug are, however, exactly in the case of frequent use, not robust enough and can be easily damaged.

The aforementioned battery units are, in the case of field devices, moreover, only equipped with an, especially symmetric, preferably centrally arranged, contacting. Such battery units use, however, due to their construction, only one possible installed position, in which they can be connected with the electronics unit and/or applied in a housing.

Due to safety concerns and constraints, the battery unit must be transported isolated from the associated device. Additionally, for certain transport paths, e.g. in the case of transport by means of airplane, the particular device is not permitted to be turned on during the transport.

Furthermore, it is disadvantageous in the case of the solutions known from the state of the art that after the contacting there is always a certain discharge current, which leads to a lessened service life of the battery and thus of the respective device.

Known from the state of the art, especially from international application WO 2006/027284 A1, is an apparatus for locking electrical and electronic devices with battery packs for electrical current supply. A two stage locking of the disposable battery pack is provided, wherein in a first installed position still no contact occurs between the connections of the battery pack and the provided, electrical, electronic tool and wherein electrical contact is produced only in a second installed position, which is produced by pushing the battery pack into the electrical, electronic tool. Since the contacting occurs by pushing the disposable battery pack in, however, this means that, in WO 2006/027284 A1, sufficient space must be provided for at least two installed positions. This is, however, exactly in the case of devices, in which the battery unit is accommodated completely in a housing, often not possible. Furthermore, in the case of WO 2006/027284, the battery must be accessible from the outside or the housing must be opened.

SUMMARY OF THE INVENTION

It is, consequently, an object of the present invention to provide a space saving apparatus, which makes possible a variable supplying of an electronics unit with electrical energy from a battery unit.

The object is achieved according to the invention by an apparatus, wherein by orienting, especially by rotating, the first formed part, respectively the second formed part, the first formed part and the second formed part are connectable with one another in different installed positions, and wherein the energy supply of the electronics unit occurs from the battery unit as a function of the installed position, in which the first formed part is connected with the second formed part.

The battery unit can thus, by orienting the first formed part, be brought into a first position, so that the first formed part is connectable with the second formed part in a first installed position. By orienting the first formed part relative to the second formed part, the first formed part can likewise be brought into a second position, so that the first formed part is connectable with the second formed part in a second installed position differing from the first installed position. In the different installed positions, the battery unit can be connected, at least mechanically, with the electronics unit via the first and second formed parts. Serving in this regard can be a force interlocking connection between the formed parts, for example, by means of at least one bolt, rivet and/or thread, threaded screw connection or a plugged connection. The first and second formed parts can additionally have, at least in the different installed positions, especially essentially exactly mutually fitting shapes.

Naturally, instead of the first formed part, also the second formed part can be oriented, since, in the case of the installed position, only the positions of the two parts relative to one another is decisive. Since the battery unit and the first formed part are, however, often smaller and lighter and, thus, easier to handle than the electronics unit, which is additionally often arranged in a housing at the point in time of the connecting with the battery unit, focus here will be on the battery unit, respectively its first formed part, for describing the orienting, especially the rotation, for example, into the first, respectively second position, via which a connection in the first, respectively second installed position, is enabled.

The orienting of the battery unit, respectively the first formed part, occurs, in such case, preferably by rotating the battery unit, respectively the first formed part, for example, about an axis or also, in given cases, a number of axes, of the battery unit. The battery unit can have, for example, a number of sides, wherein different sides can be provided for connecting the battery unit with, the electronics unit, and wherein the energy supply of the electronics unit occurs as a function of the installed position, in which the battery unit is connected with the electronics unit. Naturally, also orienting the battery unit by means of rotation about a single axis can be used to transfer from the first position into the second position, so that a connecting of the battery unit can occur in the first or the second installed position. Preferably, in such case, the connection between the first formed part and the second formed part occurs via the same side of the battery unit, so that, by rotation about an axis extending from this side, transfer is possible from the first position into the second position and the battery unit, thus, is connectable in the first or second installed position with the electronics unit.

In a first installed position, then, for example, an energy supply of the electronics unit can occur with a first predetermined value, for example, a first predetermined electrical current- and/or voltage value, while, in a second installed position, the energy supply can occur with a second predetermined value, for example, a second predetermined electrical current- and/or voltage value. In such case, the first and second predetermined electrical current- and/or voltage values can differ from one another. The corresponding means for voltage limiting can be, in such case, part of the battery unit and/or part of the electronics unit. It can, in such case, be, for example, a corresponding diode arrangement or other electrical current- and/or voltage limiting means contacted in the first, or the second, installed position on the battery unit and/or the electronics unit. Especially, an installed position can be provided, in which the electronics unit is not supplied with energy from the battery unit, for example, in that the connection between the battery unit is a mechanical contact, but no electrical, especially galvanic, contact is formed.

Furthermore, the first formed part and the second formed part can be so embodied that, by rotation about an axis, transfer is possible from the first position into the second position, so that the battery unit can be connected with the electronics unit in the first or the second installed position.

In a form of embodiment of the apparatus, the battery unit is electrically connected with the electronics unit in a first installed position and serves for energy supply of the electronics unit. The first installed position of the first and second formed parts can, thus, serve not only for electrical connection but also for mechanical connection of the battery unit with the electronics unit.

In an additional form of embodiment of the apparatus, the first formed part of the battery unit is connected in a second installed position with the second formed part of the electronics unit, without the battery unit being electrically connected with the electronics unit. The second installed position serves thus only for mechanical connection of the battery unit with the electronics unit.

In an additional form of embodiment of the apparatus, the first formed part, respectively the second formed part, forms a housing, which at least partially contains a battery of the battery unit, or the electronics unit. The electronics unit as well as the battery unit can, including their housings, be accommodated in a further housing, for example, that of a field device. This housing can have, for example, a removable lid, wherein the battery unit is insertable into the housing through the opening closable by the lid and connectable with the electronics unit. The housing of the electronics unit and/or of the battery unit is composed, in such case, for example, of a synthetic material, in which, for example, the battery, or the building blocks of the electronics unit are at least partially held by a cast potting compound.

In an additional form of embodiment of the apparatus, the energy supply occurs via at least one contact element, respectively contercontact element, wherein the contact element, respectively contercontact element, is especially a socket, respectively a plug, which are placed on the first, respectively the second, formed part. The contact element can, in such case, be connected with the battery unit and the contercontact element with the electronics unit. The contact, respectively contercontact, element can be contact elements fitting with one another, which, for example, engage in one another, in order to produce the mechanical and/or electrical connection between the battery unit and the electronics unit.

In an additional form of embodiment of the apparatus, the second formed part includes at least one dummy contercontact element, for example, a dummy socket, respectively a dummy plug, into which the contact element of the battery unit is introducible, wherein the dummy countercontact element produces no electrical contact.

The second formed part can, thus, in this form of embodiment, have at least one contercontact element and one dummy countercontact element. The contact element of the battery unit can then, in the first installed position, be connected with the contercontact element, so that an electrical contact is present between the battery unit and the electronics unit or the contact element of the battery unit can, in the second installed position, be connected with the dummy countercontact element, so that the battery unit is only mechanically connectable with the electronics unit. Alternatively, the battery unit can have a contact element and a dummy contact element, wherein the electronics unit then has at least one contercontact element, so that, in the first installed position, the contercontact element is connected with the contact element and wherein, in the second installed position, the contercontact element is connected with the dummy contact element. The connection between the first and second formed parts can, in such case, be produced with application of known securement means, such as a detent element or a screw element.

In an additional form of embodiment of the apparatus, the dummy countercontact element and the contercontact element are symmetrically arranged with respect to a shared axis, especially a symmetry axis, of the first and second formed parts, wherein the at least one contact element of the battery unit is asymmetrically, especially decentrally, arranged with respect to the axis, especially the symmetry axis. By this symmetric arrangement, in the case of which the dummy countercontact element and the contercontact element lie e.g. on a circular line or mirror symmetrically with respect to a plane through the axis, especially the symmetry axis, the contact element of the first formed part can be brought easily, especially by rotation, into the first, or second position, so that the connection between battery unit and electronics unit can occur in the first or the second installed position.

In an additional form of embodiment of the apparatus, the first formed part includes at least one dummy contact element, for example, a dummy socket, or a dummy plug, into which the contercontact element of the electronics unit is introducible, wherein the dummy contact element produces no electrical contact. The dummy contact element serves only for mechanical connection, respectively for accommodating the contercontact of the electronics unit, in order that a mechanical connection between the battery unit and the electronics unit is producible, in which the first and second formed parts can be joined to one another, essentially with accurate fit.

In an additional form of embodiment of the apparatus, the dummy contact element and the contact element are arranged symmetrically with respect to a shared axis, especially a symmetry axis, of the first and second formed parts, and the at least one contercontact element of the battery unit is arranged asymmetrically with respect to the axis, preferably the symmetry axis.

In an additional form of embodiment of the apparatus, transfer from the first position to the second position is possible by rotating the battery unit relative to the electronics unit, especially around the one axis, preferably a symmetry axis, so that an installation of the battery unit can occur either in the first or in the second installed position.

In an additional form of embodiment of the apparatus, the contact element, the contercontact element and the dummy contact element, respectively the dummy countercontact element, are arrangeable by orienting, especially by rotating, preferably by 180°, the battery unit, respectively the electronics unit, in the different positions, so that they are connectable, especially pluggable into one another, in the different installed positions. The orienting of the battery unit occurs, in such case, by rotating about an axis of the battery unit.

In an additional form of embodiment of the apparatus, the first formed part and the second formed part have, in each case, a front side, on which the contact element, the contercontact element and dummy contact element, respectively the dummy countercontact element, are arranged, wherein the first and second formed parts are arrangeable essentially to coincide in each of the provided, installed positions, at least on the front sides between the first and second formed parts. By such an arrangement, a space saving installation of the battery unit can be achieved. In such case, the orienting of the battery unit can occur by corresponding rotation about an axis, which passes, especially centrally, through the front side.

The object is achieved, furthermore, by a battery unit for use in an apparatus of the invention. The proposed battery unit is for this purpose connectable with an electronics unit in a plurality of installed positions. Preferably, the battery unit has therefor in the region of the first formed part at least one contact element, which is connectable with a corresponding contercontact element of the electronics unit, wherein, via the first and second formed parts as a function of the installed position, a mechanical and/or also electrical connection can be produced between the battery unit and the electronics unit. Furthermore, the battery unit can have a dummy contact element. In such case, the contact, or dummy contact, element of the battery unit can be arranged offset from an axis extending centrally through the battery unit. In this way, the battery unit can be brought, especially by rotating around this central axis, into first and second positions, so that the battery unit is connectable with the electronics unit, especially in the first, respectively the second, installed position.

The object is likewise achieved by an operating electronics for use in an apparatus of the invention. The electronics unit can have in the region of the second formed part correspondingly at least a first contercontact element, so that the battery unit is connectable with the contercontact element in a plurality of installed positions, wherein via the first and second formed parts, as a function of the installed position, a mechanical and/or also electrical connection can be produced between the battery unit and the electronics unit.

Furthermore, besides the contercontact element, a dummy countercontact element can be provided, wherein the dummy countercontact element is arranged symmetrically to an axis extending, especially centrally, through the electronics unit, preferably on the same side of the electronics unit. In this way, by orienting the battery unit, especially by rotating the battery unit about an axis of the battery unit, either the contercontact element or the dummy countercontact element of the electronics unit can be contacted by the contact element of the battery unit.

Furthermore, the object is achieved by a field device of process automation technology, especially with a radio unit, having an apparatus of the invention. As already mentioned above, such battery unit is required, for example, for operating autarkic field devices, especially radio field devices, which, for example, have been retrofitted with a radio unit. For the purpose of transport or for interrupting the energy supply of such a field device or such a radio unit, the field device, or the radio unit, can have an electronics unit, and a battery unit, of the invention.

In a form of embodiment of the field device, the field device is an autarkic field device, in the case of which energy supply occurs only by means of the battery unit.

BRIEF DESCRIPTION OF THE DRAWINGS

The invention will now be explained in greater detail based on the appended drawing, the figures of which show as follows:

FIG. 1(a) is a schematic representation of a plan view onto the front side of a formed part of an electronics unit; and FIG. 1(b) is a schematic representation of a section through an electronics housing and a battery housing at the level of the contact, respectively countercontact, elements.

DETAILED DISCUSSION IN CONJUNCTION WITH THE DRAWINGS

FIG. 1(a) shows a plan view onto a front side S of the electronics unit E. In such case, the housing of the electronics unit, also referred to as electronics housing EH, is visible, wherein the electronics housing EH forms in the region of the front side S a second formed part, with which a first formed part of a battery unit P is connectable. Also shown in FIG. 1(a) are a contercontact element CK and a dummy countercontact element D, wherein via the contercontact element CK an electrical connection occurs between the battery unit P and the electronics unit E, while the dummy countercontact element D serves only for accommodating the contact element K of the battery unit, in order to enable a mechanical, essentially exactly fitting connection between the first formed part of the battery unit P and the second formed part of the electronics unit E. By rotating the electronics unit E including electronics housing EH about an axis A, the position of the electronics unit can be changed, so that a battery unit P can be connected with the electronics unit E in the first or the second installed position.

FIG. 1(b) shows a schematic representation of a section through an electronics unit E, having an electronics housing EH, and a battery unit P, having a battery housing BH, at the level of the contact, countercontact, respectively dummy contact elements K, CK, D. In such case, the battery unit P and the electronics unit E are in a further housing, for example, of a field device. For better illustration, the battery unit P is not shown in the first installed position, but, instead, in a first position so that the battery unit P is connectable with the electronics unit E in the first installed position. The battery unit P includes in the example of an embodiment according to FIG. 1(b) a contact element K, which can engage with the contercontact element CK of the electronics unit E, so that a supplying of the electronics unit E with electrical energy from a battery of the battery unit P can occur.

The contact element K is composed, in such case, of a socket, which is part of the first formed part F1, and a plug, which is part of the second formed part F2, and these can engage with one another. Plug and socket can, in such case, be surrounded by a plug- or socket housing, which can serve both for contact protection, for mechanical strength of the connection as well as also for shielding.

The plug contacts of the plug are, in such case, connected with a circuit board CB, on which electronic components of the electronics unit E are arranged.

Furthermore, a dummy countercontact element D is provided, into which the contact element K of the battery unit P can be brought. This represents the second installed position, in which the battery unit P and electronics unit are connectable with one another. In this second installed position, the battery unit P is not connected with the circuit board CB of the electronics unit E, so that no electrical connection is present between the battery unit P and the electronics unit E. The second installed position can, thus, be used for transport securement of the battery unit P.

The first and second formed parts F1, F2 and the housing of the battery unit P and the electronics unit E can, in such case, be formed of a plastic material or other suitable electrically insulating material.

The invention claimed is:

1. An apparatus having:
    an electronics unit; and
    a battery unit for energy supply of said electronics unit, wherein:
    said battery unit has a first formed part; and
    said electronics unit has a second formed part;
    wherein said first and said second formed parts are connectable with one another by rotating the battery unit relative to the electronics unit so that the first formed part and the second formed part are connectable with one another in different installed positions, and the energy supply of the electronics unit occurs from the battery unit as a function of the installed position, in which the first formed part is connected with the second formed part.

2. The apparatus as claimed in claim 1, wherein:
    said battery unit is electrically connected with said electronics unit in a first installed position and serves for energy supply of said electronics unit.

3. The apparatus as claimed in claim 1, wherein:
    said first formed part of said battery unit is connected in a second installed position with said second formed part of said electronics unit, without said battery unit being electrically connected with said electronics unit.

4. The apparatus as claimed in claim 1, wherein:
said first formed part, respectively said second formed part forms a housing, which contains a battery of said battery unit, or said electronics unit.

5. The apparatus as claimed in claim 1, wherein:
the energy supply occurs via at least one contact element, respectively countercontact element; and
said contact element, respectively countercontact element, is especially a socket, respectively a plug, which are placed on said first, respectively said second, formed part.

6. The apparatus as claimed in claim 1, wherein:
said second formed part includes at least one dummy countercontact element, for example, a dummy socket, respectively a dummy plug, into which said contact element of said battery unit is introducible; and
said dummy countercontact element produces no electrical contact.

7. The apparatus as claimed in claim 6, wherein:
said dummy countercontact element and said countercontact element are symmetrically arranged with respect to a shared axis, especially a symmetry axis, of said first and of said second formed parts; and
said at least one contact element of said battery unit is asymmetrically, especially decentrally, arranged with respect to the axis, preferably the symmetry axis.

8. The apparatus as claimed in claim 6, wherein:
said contact element, said countercontact element and said dummy contact element, respectively are arrangeable, especially pluggable, by orienting, especially by rotating, preferably by 180°, said battery unit, respectively said electronics unit, into the different installed positions.

9. The apparatus as claimed in claim 1, wherein:
said first formed part includes at least one dummy contact element, for example, a dummy socket, or a dummy plug, into which said countercontact element of said electronics unit is introducible; and
said dummy contact element produces no electrical contact.

10. The apparatus as claimed in claim 9, wherein:
said dummy contact element and said contact element are arranged symmetrically with respect to a shared axis, especially a symmetry axis, of said first and said second formed parts; and
said at least one countercontact element of said electronics unit is arranged asymmetrically with respect to the axis, preferably the symmetry axis.

11. The apparatus as claimed in claim 1, wherein:
transfer from a first position of said battery unit relative to said electronics unit into a second position is possible, especially by rotating around the axis, in the case of which it preferably is a symmetry axis, so that the battery unit is connectable with said electronics unit in said first or said second installed position.

12. The apparatus as claimed in claim 1, wherein:
said first formed part and said second formed part have, in each case, a front side, on which said contact element, said countercontact element and said dummy contact element, respectively are arranged; and
said first and said second formed parts are arrangeable essentially to coincide in each of the provided, installed positions, at least on the front sides between said first and said second formed parts.

13. A battery unit for use in an apparatus having:
an electronics unit; and
a battery unit for energy supply of said electronics unit, wherein:
said battery unit has a first formed part; and
said electronics unit has a second formed part;
wherein said first and said second formed parts are connectable with one another by rotating the battery unit relative to the electronics unit so that the first formed part and the second formed part are connectable with one another in different installed positions, and the energy supply of the electronics unit occurs from the battery unit as a function of the installed position, in which the first formed part is connected with the second formed part.

14. An electronics unit for use in an apparatus having:
an electronics unit; and
a battery unit for energy supply of said electronics unit, wherein:
said battery unit has a first formed part; and
said electronics unit has a second formed part;
wherein said first and said second formed parts are connectable with one another by rotating the battery unit relative to the electronics unit so that the first formed part and the second formed part are connectable with one another in different installed positions, and the energy supply of the electronics unit occurs from the battery unit as a function of the installed position, in which the first formed part is connected with the second formed part.

15. A field device of process automation technology, especially with a radio unit, having an apparatus:
an electronics unit; and
a battery unit for energy supply of said electronics unit, wherein:
said battery unit has a first formed part; and
said electronics unit has a second formed part;
wherein said first and said second formed parts are connectable with one another by rotating the battery unit relative to the electronics unit so that the first formed part and the second formed part are connectable with one another in different installed positions, and the energy supply of the electronics unit occurs from the battery unit as a function of the installed position, in which the first formed part is connected with the second formed part.

16. The field device as claimed in claim 15, wherein:
the field device is an autarkic field device, in the case of which the energy supply occurs only by means said battery unit.

\* \* \* \* \*